United States Patent
Musa et al.

(10) Patent No.: US 12,470,213 B2
(45) Date of Patent: Nov. 11, 2025

(54) HIGH SPEED HIGH SWING DRIVER FOR DIRECT DRIVE PHOTONIC MODULATORS

(71) Applicant: CIENA CORPORATION, Hanover, MD (US)

(72) Inventors: Faisal Ahmed Musa, Stittsville (CA); Ahmed Mustafa, Kanata (CA); Naim Ben Hamida, Ottawa (CA); Bruce Beggs, Ottawa (CA)

(73) Assignee: CIENA CORPORATION, Hanover, MD (US)

( * ) Notice: Subject to any disclaimer, the term of this patent is extended or adjusted under 35 U.S.C. 154(b) by 107 days.

(21) Appl. No.: 18/434,092

(22) Filed: Feb. 6, 2024

(65) Prior Publication Data
US 2025/0253845 A1    Aug. 7, 2025

(51) Int. Cl.
*H03K 17/08* (2006.01)
*G02F 1/01* (2006.01)
*H03K 17/687* (2006.01)

(52) U.S. Cl.
CPC ....... *H03K 17/6872* (2013.01); *G02F 1/0121* (2013.01)

(58) Field of Classification Search
CPC ............ H03K 3/02; H03K 3/023; H03K 5/22; H03K 5/24; H03K 5/2472; H03K 5/2481; H03K 17/08; H03K 17/086; H03K 17/081; H03K 17/08104; H03K 17/51; H03K 17/56; H03K 17/687; H03K 17/6872; H03F 1/22; H03F 1/52; H03F 1/523; H03F 3/45; H03F 3/45071; G02F 1/01; G02F 1/0121
See application file for complete search history.

(56) References Cited

U.S. PATENT DOCUMENTS 11,290,073 B1 *   3/2022   Lim ........................ H03F 1/523
2020/0014344 A1   1/2020   Arayashiki et al.

FOREIGN PATENT DOCUMENTS

EP    2237425 A1   10/2010

OTHER PUBLICATIONS

Asada, H., et al., "A 60GHz CMOS power amplifier using capacitive cross-coupling neutralization with 16 % PAE", 2011 41st European Microwave Conference, Manchester, UK, 2011, pp. 1115-1118, Aug. 15, 2023.
Kim, J., et al., "A_224-GB/s DAC-Based PAM-4 Quarter-Rate Transmitter With 8-Tap FFE in 10-nm FinFET", IEEE Journal of Solid State Circuits, Jan. 2022, pp. 6-20.
Li, H., et al., "A 3-D-Integrated Silicon Photonic Microring-Based 112-GB/s PAM-4 Transmitter With Nonlinear Equalization and Thermal Control", IEEE Journal of Solid-State Circuits, vol. 56, No. 1, pp. 19-29, Jan. 2021.

(Continued)

*Primary Examiner* — Long Nguyen
(74) *Attorney, Agent, or Firm* — Guntin & Gust, PLC; Dana B. LeMoine

(57) ABSTRACT

An integrated circuit device includes a digital-to-analog converter with multiple bit slices, each bit slice having a differential pair of driver transistors. A driver circuit includes the differential pairs of driver transistors, multiple series cascode transistors, and current bleed paths to modify drain-to-source currents in the various cascode transistors. Additional embodiments include series peaking circuits, back termination networks, and neutralization capacitors. Other embodiments are disclosed.

20 Claims, 13 Drawing Sheets

(56) References Cited

OTHER PUBLICATIONS

Rafique, J., et al., "A 4.6V, 6-bit, 64GS/s Transmitter in 22nm FDSOI CMOS", 2019 IEEE BiCMOS and Compound semiconductor Integrated Circuits and Technology Symposium (BCICTS), Nashville, TN, USA, 2019, pp. 1-4.
Wang, Z., et al., "An Output Bandwidth Optimized 200-GB/s PAM-4 100-GB/s NRZ Transmitter With 5-Tap FFE in 28-nm CMOS", IEEE J. of Solid State Circuits, Jan. 2022, pp. 21-31.
International Search Report & Written Opinion for PCT/US2025/014435 mailed May 23, 2025, 13 pp.
Jing-Hwa, et al., "A Wideband Power 1-14 Amplifier in 45 nm CMOS SOI Technology for X Band Applications", IEEE Microwave and Wireless Components Letters, IEEE Service Center, New York, NY, US, vol. 23, No. 11, pp. 587-589, Sep. 6, 2013.

* cited by examiner

HIGH SPEED HIGH SWING DRIVER FOR DIRECT DRIVE PHOTONIC MODULATORS

FIELD OF THE DISCLOSURE

The subject disclosure relates to amplifier and driver devices.

BACKGROUND

Operating speeds of amplifiers and driver devices continue to increase. The gain-bandwidth tradeoff exhibited by amplifiers and driver devices becomes more acute as operating speeds continue to increase. The gain-bandwidth tradeoff has the effect of choosing gain (output peak-to-peak voltage) over bandwidth (high speed operation), or in the alternative, choosing bandwidth over gain.

BRIEF DESCRIPTION OF THE DRAWINGS

Reference will now be made to the accompanying drawings, which are not necessarily drawn to scale, and wherein.

DETAILED DESCRIPTION

Figure 1:
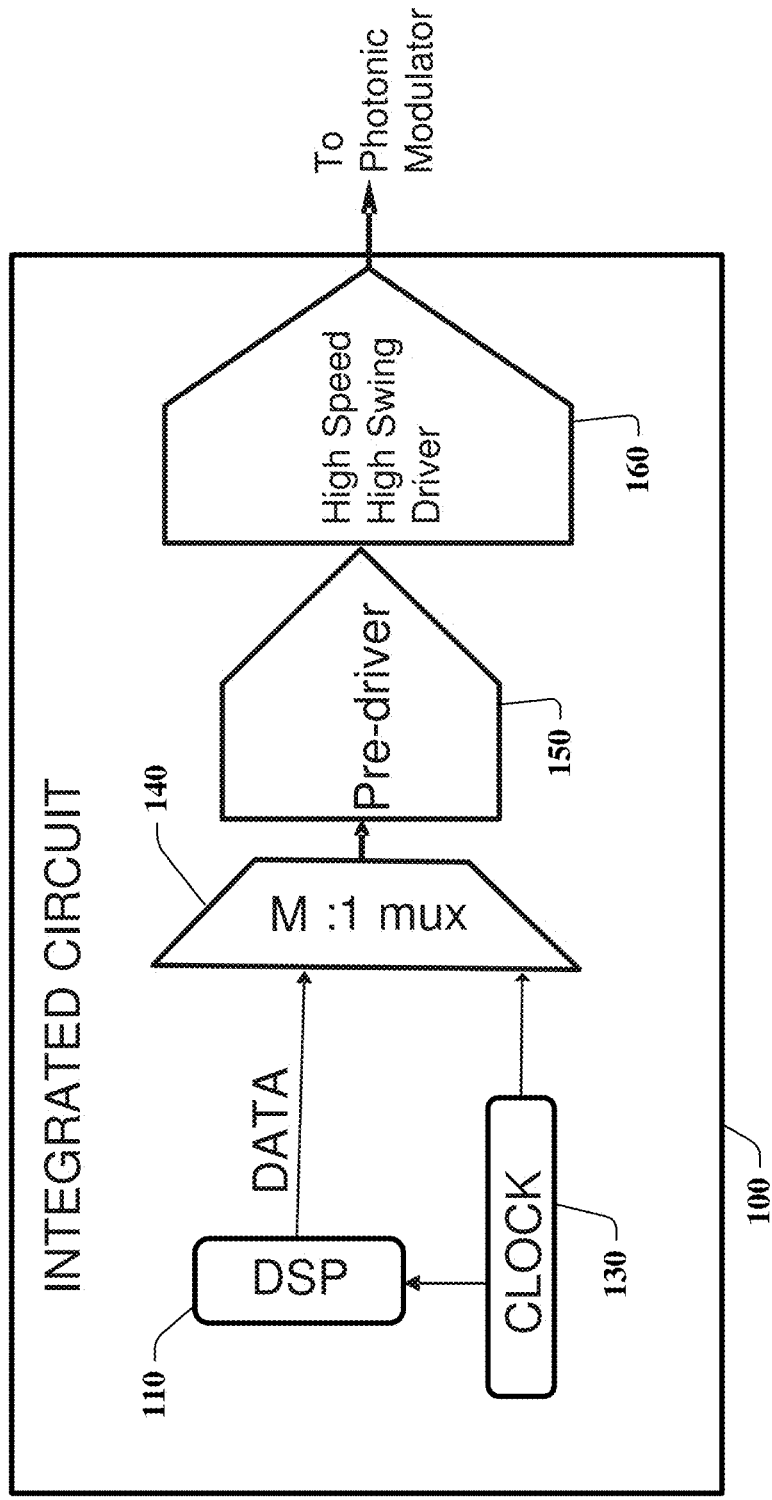
FIG. 1 shows a block diagram illustrating example, non-limiting embodiments of an integrated circuit that includes a high speed, high swing driver device in accordance with various aspects described herein.

One or more aspects of the subject disclosure include a device having a first differential pair of transistors, first and second pairs of cascode transistors, and an output network. The first differential pair of transistors include drain nodes coupled to a differential pair of combiner nodes, source nodes coupled in common to a first tail current source, and gate nodes coupled to output nodes of a pre-driver stage. The first pair of cascode transistors includes drain nodes, gate nodes coupled in common to a first cascode bias node, and source nodes coupled to the differential pair of combiner nodes, where the first pair of cascode transistors have a first breakdown voltage. The second pair of cascode transistors include drain nodes, source nodes coupled to the drain nodes of the first pair of cascode transistors, and gate nodes coupled in common to a second cascode bias node, where the second pair of cascode transistors have a second breakdown voltage, where the second breakdown voltage is higher than the first breakdown voltage. The output network is coupled to the drain nodes of the second pair of cascode transistors.

Additional aspects include a plurality of differential pairs of transistors having drain nodes coupled to the differential pair of combiner nodes, wherein each differential pair of transistors of the plurality of differential pairs of transistors have source nodes coupled in common to one of a plurality of tail current sources, wherein the first differential pair of transistors is one of the plurality of differential pairs of transistors, and wherein the first tail current source is one of the plurality of tail current sources.

Additional aspects include a first pair of current bleed paths configured to conduct a first pair of bleed currents from the source nodes of the first pair of cascode transistors; and a second pair of current bleed paths configured to conduct a second pair of bleed currents from the source nodes of the second pair of cascode transistors. According to some aspects, each of the second pair of current bleed paths are configured to turn on when a source voltage on a corresponding one of the second pair of cascode transistors rises above a threshold voltage. Further in some aspects, each of the second pair of current bleed paths are configured to maintain at least a drain-to-source current through a corresponding one of the second pair of cascode transistors. In still further aspects, the second pair of current bleed paths are configured to set a maximum voltage on the drain nodes of the second pair of cascode transistors.

Additional aspects include the device being configured to provide control of a first cascode bias voltage on the first cascode bias node from outside the device and/or being configured to provide control of a second cascode bias voltage on the second cascode bias node from outside the device. Further aspects include a back termination network coupled between the differential pair of combiner nodes.

Additional aspects include the output nodes of the pre-driver stage having a first output node and a second output node, wherein the first output node is coupled to a gate node of a first transistor of the first differential pair of transistors and the second output node is coupled to a gate node of a second transistor of the first differential pair of transistors. Further aspects include the pre-driver stage having a first pre-driver transistor having a drain node coupled to the first output node of the pre-driver stage, a first active inductor device coupled to the first output node of the pre-driver stage, a second pre-driver transistor having a drain node coupled to the second output node of the pre-driver stage, and a second active inductor device coupled to the second output node of the pre-driver stage. Further aspects include the first and second active inductor devices being configured to be responsive to an active inductor bias voltage, where the device is configured to provide control of the active inductor bias voltage from outside the device.

Additional aspects include a first neutralization capacitor coupled between the first output node of the pre-driver stage and the drain node of the second transistor of the first differential pair of transistors, and a second neutralization capacitor coupled between the second output node of the pre-driver stage and the drain node of the first transistor of the first differential pair of transistors.

One or more aspects of the subject disclosure include a device having a plurality of pairs of differential transistors having drain nodes coupled to a pair of differential combiner nodes, wherein each pair of differential transistors of the plurality of pairs of differential transistors have source nodes coupled in common to a corresponding one current source of a plurality of current sources, a pair of differential output nodes, a double cascode network of transistors coupled between the pair of differential combiner nodes and the pair of differential output nodes, and at least one current bleed path coupled to the double cascode network of transistors, wherein the at least one current bleed path is configured to provide a drain-to-source current through at least one transistor of the double cascode network of transistors.

Additional aspects include a back termination network coupled between the pair of differential combiner nodes, wherein the back termination network includes at least one resistor, the double cascode network of transistors being configured to be responsive to a bias voltage that can be varied from outside the device, the double cascode network of transistors including a first pair of cascode transistors having a first breakdown voltage, and a second pair of cascode transistors having a second breakdown voltage, where the first and second breakdown voltages are different.

One or more aspects of the subject disclosure include a method. The method can comprise providing a first pair of cascode transistors having a first breakdown voltage, wherein the first pair of cascode transistors are coupled to an output of a differential amplifier; providing differential output nodes; providing a second pair of cascode transistors having a second breakdown voltage, wherein the second pair of cascode transistors are coupled between the first pair of cascode transistors and the differential output nodes, and wherein the second breakdown voltage is greater than the first breakdown voltage. The method can further comprise providing at least one first current bleed path coupled to at least one transistor of the first pair of cascode transistors, wherein the at least one first current bleed path is configured to maintain at least a first drain-to-source current through the at least one transistor of the first pair of cascode transistors, and providing at least one second current bleed path coupled to at least one transistor of the second pair of cascode transistors, wherein the at least one second current bleed path is configured to maintain at least a second drain-to-source current through the at least one transistor of the second pair of cascode transistors.

Various embodiments include integrated circuits that employ a high swing, high bandwidth driver device implemented with NMOS-only double cascode with open drain as the output stage of a 7-bit DAC. The NMOS-only embodiments described herein provide for less process variation as compared to embodiments that include both PMOS and NMOS together on the same die. Various embodiments, mitigates the risk of overvoltage on the cascodes and driver core transistors by implementing the cascode nearest to the bumps using a high voltage thick oxide device that can withstand higher voltages and protect the lower cascode and core driver circuit. In various embodiments, a lumped cascode device facing the bump reduces latch up issues and more easily satisfies associated layout constraints as compared to core devices distributed over multiple slices of a 7-bit DAC. Various embodiments implement pre-driver stages as NMOS common source amplifier with a programmable active inductor that may be controlled by an external bias voltage, allowing optimization of swing and deterministic jitter using an external bias. Various embodiments include neutralizing capacitors between the pre-driver stage and driver to boost bandwidth and gain, and improve isolation between output and input. Various embodiments further boost the bandwidth by implementing each of its double cascodes as active inductors, and provide further protection from overvoltage on the core devices using bleed paths at each source node of the cascodes. Various embodiments include a back termination resistor at the summing node of the driver to further boost the bandwidth of the driver while maintaining uniform group delay over a wide range of frequencies.

FIG. 1 shows a block diagram illustrating example, non-limiting embodiments of an integrated circuit that includes a high speed, high swing driver device in accordance with various aspects described herein. Integrated circuit 100 includes a digital signal processor (DSP) 110, clock circuit 130, M:1 multiplexer (mux) 140, pre-driver 150 and high speed, high swing driver 160. In operation, DSP 110 provides digital data to mux 140, which multiplexes the data based on clock signals received from clock circuit 130. For example, mux 140 may receive two, four, or more digital data signals and may produce one serial digital data stream with the digital data signals time-multiplexed. The serial digital data stream is then provided to pre-driver 150.

Pre-driver 150 provides buffering and isolation, and drives driver 160. As described in more detail below, pre-driver 150 and driver 160 provide a high speed (high bandwidth) and high swing (high gain) driver suitable for optical communications. For example, in some embodiments, integrated circuit is a custom application specific integrated circuit (ASIC) that is capable of directly driving an optical modulator without any additional gain stages between the driver 160 and the photonic modulator.

In some embodiments, pre-driver 150 and driver 160 are implemented in an NMOS-only design without the use of PMOS devices. This provides a robust solution with low process variation across the pre-driver and driver. Other portions of integrated circuit 100 may include combinations of NMOS and PMOS device. For example, DSP 110 and other digital circuits may include CMOS circuit components that include both NMOS and PMOS devices. Also in some embodiments, integrated circuit 100 may be implemented in a process that includes three-dimensional structures such as gate nodes that wrap around multiple sides of a drain-to-source channel (e.g., a FinFET process).

Figure 2:
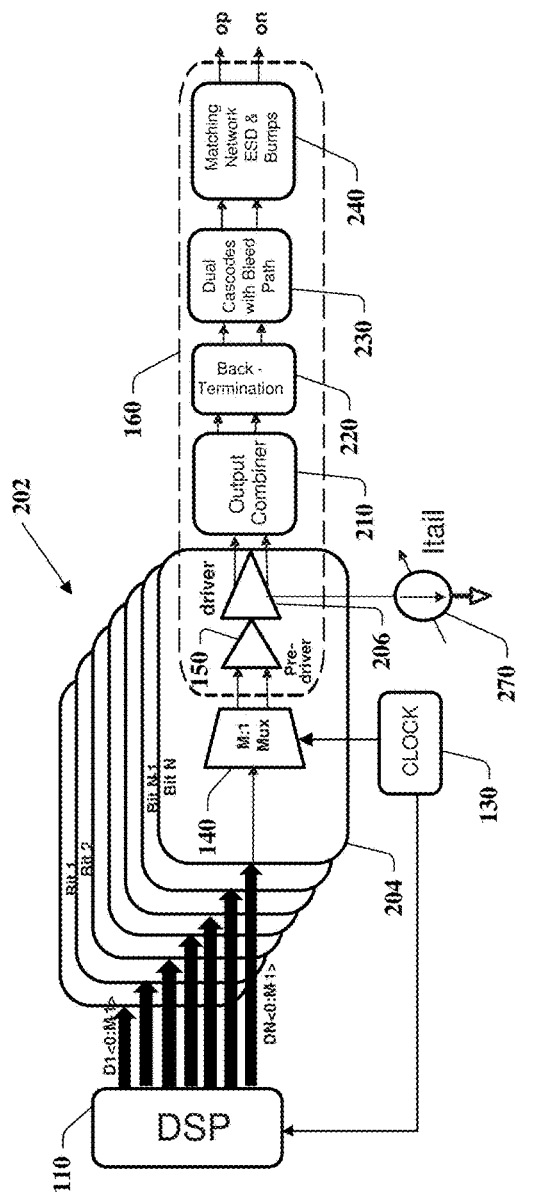
FIG. 2 shows a block diagram illustrating more detail of the high speed, high swing driver device of FIG. 1 in accordance with various aspects described herein.

FIG. 2 shows a block diagram illustrating more detail of the high speed, high swing driver device of FIG. 1 in accordance with various aspects described herein. As shown in FIG. 2, driver 160 may include a differential pair of transistors in block 206, an output combiner 210, a back termination network 220, dual cascodes with bleed paths 230, and an output network 240. Each of these components of driver 160 are described in more detail below.

FIG. 2 also shows digital to analog converter (DAC) 202. DAC 202 converts N bits of digital data into an analog signal that is then amplified by driver 160 and driven off the integrated circuit. Each of the N bits of the DAC 202 includes a mux, a pre-driver, and a differential pair of driver transistors as shown in FIG. 2. For example, bit slice 204 includes mux 140, pre-driver 150, and differential pair of transistors at block 206. Each of the N bits of DAC 202 also include a tail current source 270. The tail current source 270 sources a different amount of current for each of the DAC bits within DAC 202 to provide a different voltage gain for each differential pair of transistors within block 206. For example, in some embodiments, the data provided to DAC 202 by DSP 110 represents a digital word where each bit has a weight corresponding to the bit position. For example, in a 5 bit digital word, bit 0 may have a weighting of $2^0=1$, bit one may have a weighting of weighting of $2^1=2$, bit two may have a weighting of weighting of $2^2=4$, bit three may have a weighting of weighting of $2^3=8$, and bit four may have a weighting of weighting of $2^4=16$. In these embodiments, DAC 202 may include five bits where each of the mux, pre-driver, and driver combination receives a bit of a different weight, and the corresponding tail current source 270 provides a current value to weight the output summed at combiner 210 by the bit weight corresponding to the bit position of the input bit. DAC 202 may include any number of bits. For example, in some embodiments, N is equal to 7, and in other embodiments, N is less than 7. In some embodiments, N is greater than 7, although parasitic loading at the combiner node increases as N increases.

Figures 3, 4:
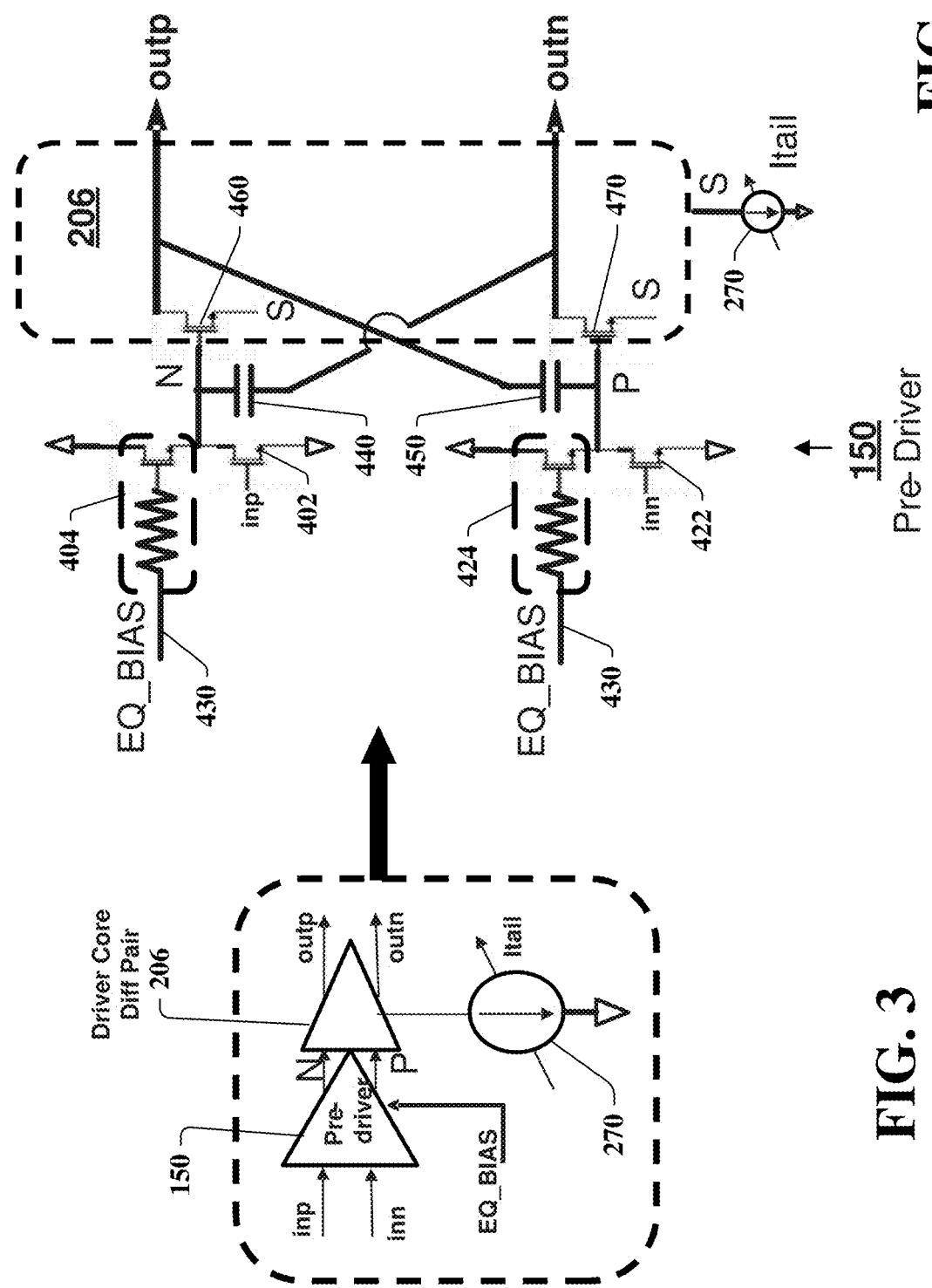
FIG. 3 shows a block diagram illustrating example, non-limiting embodiments of a pre-driver stage and driver core differential pair in accordance with various aspects described herein.
FIG. 4 shows a circuit diagram illustrating example, non-limiting embodiments of the pre-driver stage and driver core differential pair of FIG. 3 in accordance with various aspects described herein.

FIG. 3 shows a block diagram illustrating example, non-limiting embodiments of a pre-driver stage and driver core differential pair in accordance with various aspects described herein. The block diagram of FIG. 3 represents a portion of one bit slice shown in FIG. 2. For example, pre-driver 150, differential pair of transistors 206, and tail current source 270 may represent circuit components within one bit slice such as bit N as shown in FIG. 2. The components shown in FIG. 3 are replicated for each bit slice within DAC 202, where tail current source 270 sources a different current value for each bit as explained above.

FIG. 4 shows a circuit diagram illustrating example, non-limiting embodiments of the pre-driver stage and driver core differential pair of FIG. 3 in accordance with various aspects described herein. As shown in FIG. 4, pre-driver 150 includes NMOS transistor 402 receiving, on a gate node, a first digital signal (from mux 140, FIG. 2), and a second NMOS transistor 422 receiving, on a gate node, a complimentary digital signal (from mux 140, FIG. 2). The drain nodes of NMOS transistors 402 and 422 within pre-driver 150, form output nodes of pre-driver 150, and are coupled to gate nodes of the differential pair of transistors 206 of driver 160. For example, the drain node of transistor 402 is coupled to the gate node of NMOS transistor 460. Also for example, the drain node of transistor 422 is coupled to the gate node of transistor 470. The source nodes of both transistors 460 and 470 are coupled to tail current source 270.

Pre-driver 150 also includes active inductor circuits as load devices for each of transistors 402 and 422. For example, the drain node of transistor 402 is coupled to active inductor device 404 which includes an NMOS transistor having a gate node biased by an equalization bias voltage on node 430 through a resistor. Also for example, the drain node of transistor 422 is coupled to active inductor device 424 which also includes an NMOS transistor having a gate node biased by the equalization bias voltage on node 430 through a resistor.

In some embodiments, the equalization bias voltage on node 430 is selected at the design stage of the integrated circuit, and set by circuitry within the integrated circuit at a constant voltage. In other embodiments, the equalization bias voltage on node 430 may be selected from a range of voltages, or may be supplied directly from outside the integrated circuit. For example, node 430 may be coupled to a bump on the integrated circuit die to allow an external voltage to be applied to the integrated circuit and provide the equalization bias voltage on node 430.

Figure 5:
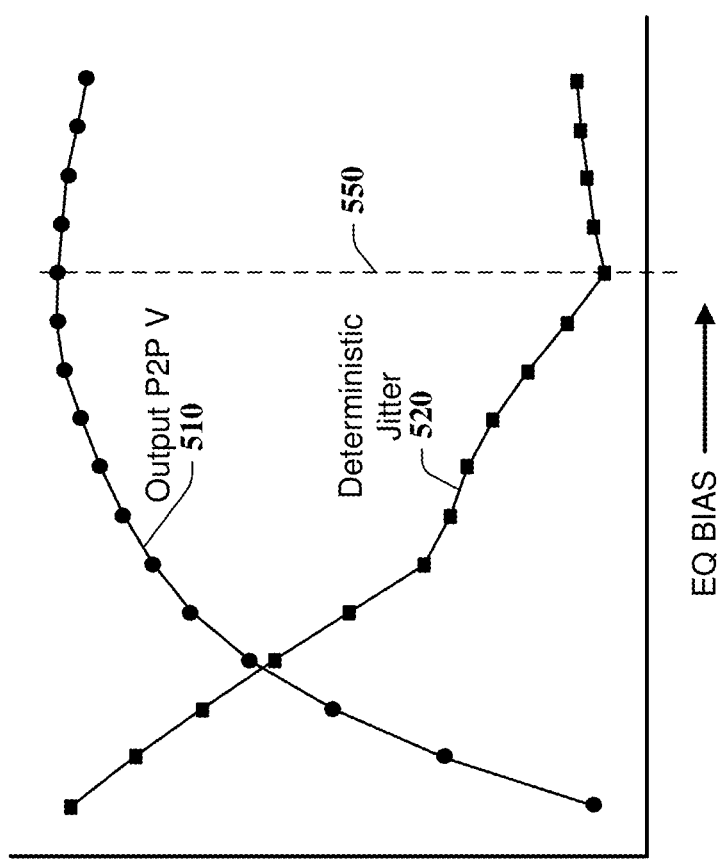
FIG. 5 shows a diagram illustrating example, non-limiting embodiments of plots showing deterministic jitter and output peak-to-peak voltage as a function of a pre-driver equalization bias voltage in accordance with various aspects described herein.

In some embodiments, the selection of the equalization bias voltage on node 430 may provide for an increased output peak-to-peak swing and a reduced deterministic jitter (DJ). Referring now to FIG. 5, the output peak-to-peak voltage 510 of driver 160 increases up to a point as the equalization bias voltage increases, and the deterministic jitter 520 decreases up to a point as the equalization bias voltage increases. Various embodiments may employ an equalization bias voltage 550 that provides a high output peak-to-peak voltage and a low deterministic jitter. In some embodiments, the output peak-to-peak voltage may be near a maximum at the same equalization bias voltage 550 that produces a minimum deterministic jitter 520. In other embodiments, a trade-off is made between output peak-to-peak voltage and deterministic jitter when selecting an equalization bias voltage 550. The components shown and described with reference to FIGS. 3, 4, and 5 provide the ability to sweep the voltage on one node (the equalization bias node 430) and simultaneously increase the peak-to-peak output voltage and reduce deterministic jitter.

FIG. 4 also shows neutralization capacitors 440 and 450. Neutralization capacitor 440 is coupled between a first output node of pre-driver 150 and a drain node of its complementary transistor within the differential pair of transistors 206. For example, as shown in FIG. 4, neutralization capacitor 440 is coupled between the drain node of transistor 402 and the drain node of transistor 470. Similarly, neutralization capacitor 450 is coupled between the second output node of pre-driver 150 and a drain node of its complementary transistor within the differential pair of transistors 206. For example, shown in FIG. 4, neutralization capacitor 450 is coupled between the drain node of transistor 422 and the drain node of transistor 460.

Figure 6:
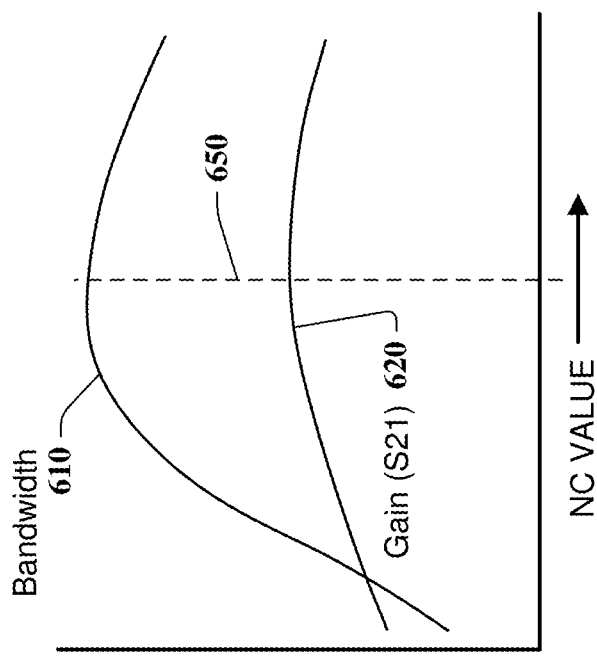
FIG. 6 shows a diagram illustrating example, non-limiting embodiments of plots showing bandwidth and gain as a function of a neutralization capacitor value in accordance with various aspects described herein.
Figure 7:
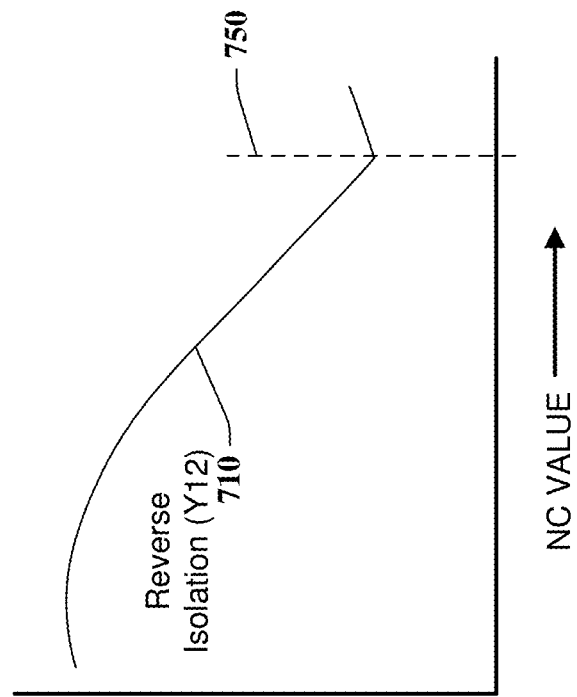
FIG. 7 shows a diagram illustrating example, non-limiting embodiments of a plot showing reverse isolation as a function of a neutralization capacitor value in accordance with various aspects described herein.

In some embodiments, neutralization capacitors 440 and 450 function to boost gain and bandwidth, and also enhance reverse isolation. Referring now to FIG. 6, the gain 620 of driver 160 at 50 GHz operation is shown as a function of the neutralization capacitor value, and bandwidth 610 is also shown as a function of the neutralization capacitor value. As shown in FIG. 6, in some embodiments, a neutralization capacitor value 650 is selected that improves both gain 620 and bandwidth 610. Various embodiments include neutralization capacitors having capacitance values that maximize gain 620 at a particular operating frequency, and/or maximize bandwidth 610. In some embodiments, the capacitance value 650 may be selected as a tradeoff between bandwidth 610 and gain 620. Also in some embodiments, a neutralization capacitance value 650 is selected that maximizes both gain 620 and bandwidth 610. Referring now to FIG. 7, the selection of neutralization capacitance value also influences reverse isolation 710. In some embodiments, a neutralization capacitor value 750 is selected that provides an improved reverse isolation 710. In some embodiments, the capacitance value selected at 750 is the same capacitance value selected at 650, which allows a single capacitor value to provide improved bandwidth and gain as well as improved reverse isolation. In other embodiments, the minimum reverse isolation 710 occurs at a different capacitance value 750 than does the increased bandwidth and gain at the capacitance value 650. In these embodiments, the capacitance value is selected as a tradeoff between improved bandwidth and gain and improved reverse isolation.

Figure 8:
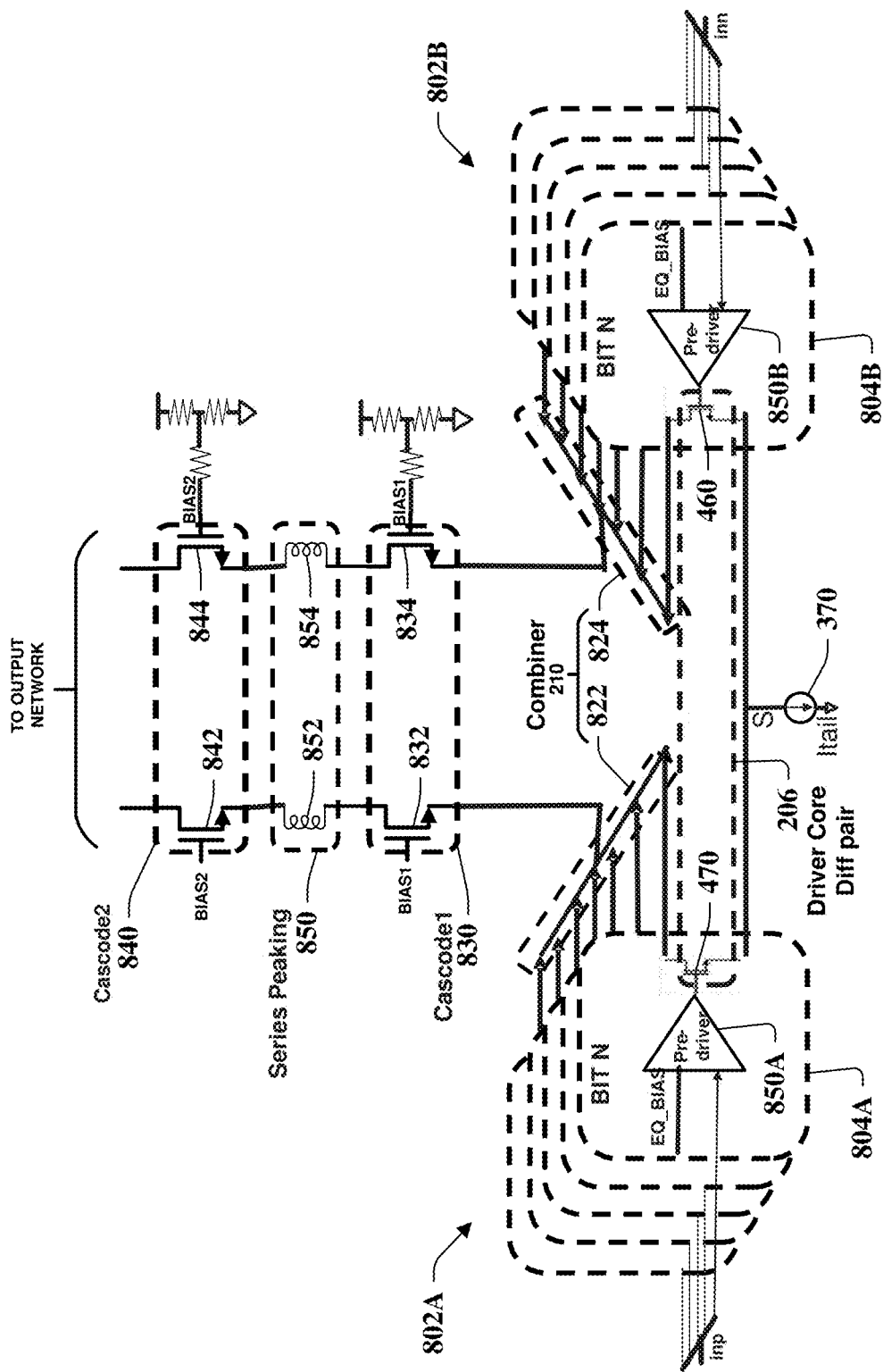
FIG. 8 shows a diagram illustrating example, non-limiting embodiments of a device having differential pairs of transistors and multiple cascode transistors in accordance with various aspects described herein.

FIG. 8 shows a diagram illustrating example, non-limiting embodiments of a device having differential pairs of transistors and multiple cascode transistors in accordance with various aspects described herein. FIG. 8 shows the pre-drivers and driver transistors of the differential transistor pairs separated into complementary components to accentuate the differential nature and operation of various embodiments of the device. For example, bit slices 802A and 802B, when taken together, include components found in DAC 202 (FIG. 2). Further, bit slices 804A and 804B when taken together, correspond to bit slice 204 (FIG. 2). Bit slices 804A and 804B each include half of pre-driver 150 (FIG. 2), and half of the differential pair of transistors in block 206 (FIG. 2). For example, pre-driver 850A includes pre-driver transistors 422 and active inductor 424 (FIG. 4), and pre-driver 850B includes pre-driver transistor 402 and active inductor 404 (FIG. 4). Also for example, bit slice 804A includes driver transistor 470, and bit slice 804B includes driver transistor 460. In some embodiments, neutralization capacitors are included coupled between the pre-driver output nodes and the drain nodes of the complementary driver transistors, although they are not shown in FIG. 8.

As shown in FIG. 8, each positive bit slice within bit slices 802A includes a pre-driver and a transistor that corresponds to half of a differential pair of driver transistors, and the drain nodes of each of these driver transistors are coupled in common at combiner node 822. Similarly, each negative bit slice within bit slice 802B includes a pre-driver and a transistor that corresponds to the other half of the differential pair of transistors. The drain nodes of each of these driver transistors are coupled in common at combiner node 824. Combiner nodes 822 and 824, when taken together, form combiner node 210 (FIG. 2).

Combiner nodes 822 and 824 combine the weighted outputs of each of the positive and negative bit slices to convert the digital data input to the bit slices to an analog voltage value at the combiner nodes. In some embodiments, the differential pairs of transistors (e.g., transistors 460 and 470) may be implemented using NMOS transistors having a moderate breakdown voltage value. For example, in some embodiments, a breakdown voltage for driver transistors 460 and 470 may be less than one Volt. As used herein, the term "breakdown voltage" refers to the maximum voltage that can be applied between the drain node and the source node of an NMOS transistor without causing damage. The breakdown voltage may be influenced by many factors, and is typically specified by integrated circuit vendors based on the type(s) of transistors instantiated in an integrated circuit design.

As shown in FIG. 8, various embodiments include multiple cascode transistors in series between the combiner nodes and the output network to allow for an output peak-to-peak voltage swing that is greater than would otherwise by supported by the differential pairs of driver transistors alone. For example, a first pair of cascode transistors 830 (e.g., transistors 832 and 834) may be included having source nodes coupled to the combiner nodes and having gate nodes with a bias voltage shown in FIG. 8 as BIAS1. Also for example, a second pair of cascode transistors 840 (e.g., transistors 842 and 844) may be included with source nodes coupled to the drain nodes of the first pair of cascode transistors, drain nodes coupled to the output network, and gate nodes with a bias voltage shown in FIG. 8 as BIAS2.

In some embodiments, cascode transistors 830 are implemented using NMOS transistors that are the same or similar type as the NMOS transistors 470 and 460 in the differential pair of transistors. For example, in some embodiments, cascode transistors 830 may have similar parameters such as a breakdown voltage as the differential pair of transistors. Also in some embodiments, cascode transistors 840 may be implemented using NMOS transistors that have different parameters as compared to cascode transistors 830 and the differential pair of transistors 470 and 460. For example, in some embodiments, cascode transistors 840 may have a higher breakdown voltage than other NMOS transistors within the device.

Cascode transistors 840 protect other circuit elements from higher voltages that may appear at the output network. For example, cascode transistors 840 may protect other circuit elements from higher supply voltages, higher output voltages, and other transients.

In some embodiments, cascode transistors 830 and 840 are sized to increase both bandwidth and gain. For example, smaller cascode devices may improve the bandwidth but also lower the gain of the driver, and larger cascode devices may improve the gain but also lower the bandwidth of the driver.

Cascode transistors 830 are shown being biased with a bias voltage of BIAS1. In some embodiments, the bias network that produces BIAS1 voltage is fixed, and in other embodiments, the bias network that produces BIAS1 may be influenced by an external node of the device. For example, a bump on the integrated circuit die may be coupled to a node within the bias network shown producing BIAS1, and BIAS1 may be modified during operation by changing a voltage on the bump of the integrated circuit die. Similarly, in some embodiments, the bias network that produces the BIAS2 voltage which biases the cascode transistors 840 may produce a fixed bias voltage, and in other embodiments, the bias network that produces BIAS2 may be influenced by an external node of the device.

As shown in FIG. 8, the bias networks that produce BIAS1 and BIAS2 may include resistive components that when taken in combination with the cascode transistors operate as an active inductor. In various embodiments, the active inductor configured cascode transistors may act to boost the bandwidth.

In some embodiments, series peaking devices 850 are included coupled between cascode transistors 830 and cascode transistors 840. For example, inductor 852 is shown coupled between the drain node of cascode transistor 832 and the source node of cascode transistor 842. Also for example, inductor 854 is shown coupled between the drain node of cascode transistor 834 and the source node of cascode transistor 844. In various embodiments, series speaking circuits 850 are tuned to provide a peak response at a frequency of interest. Further, in some embodiments, series peaking devices 850 are excluded.

Figure 9:
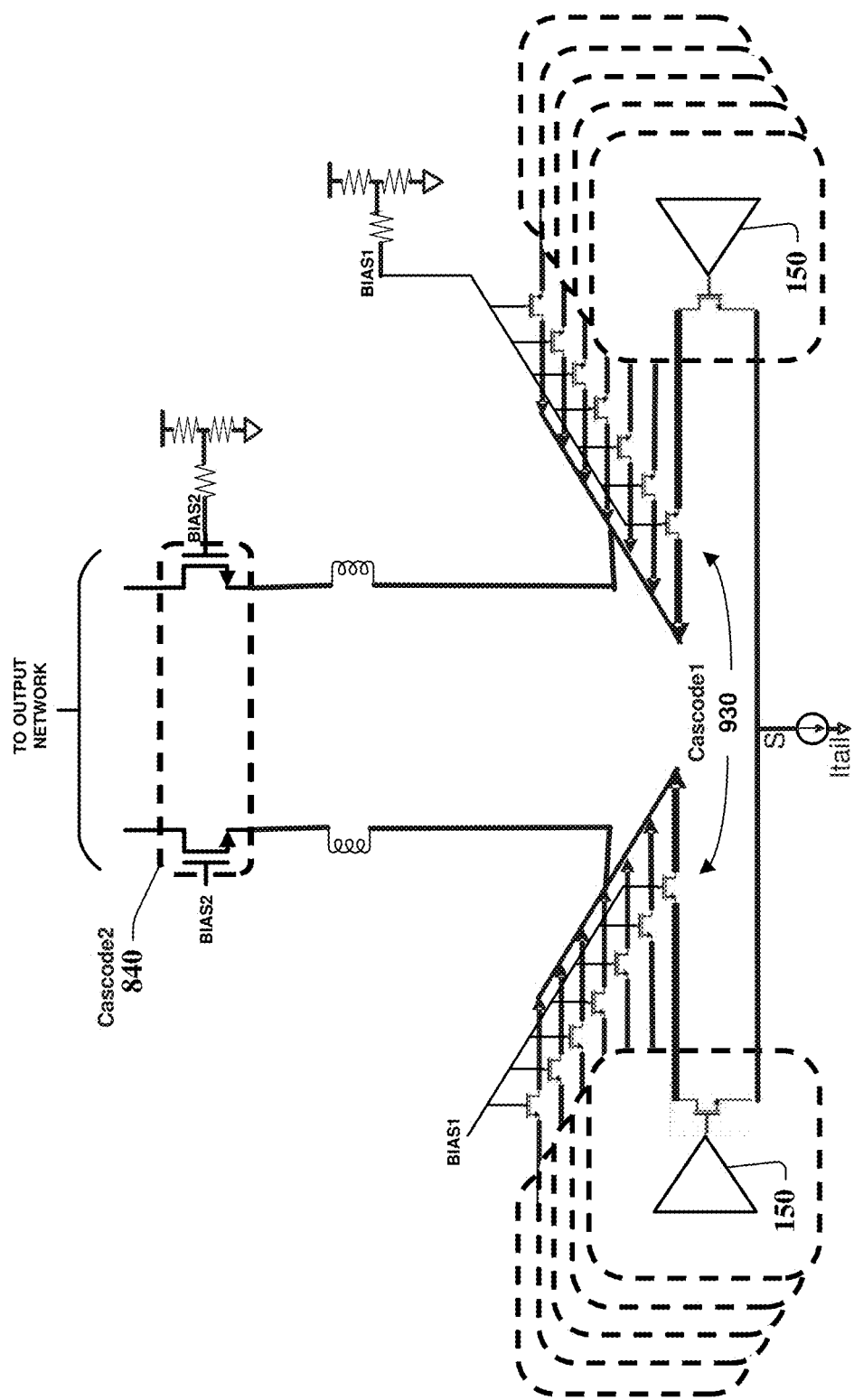
FIG. 9 shows a diagram illustrating example, non-limiting embodiments of a device having differential pairs of transistors and cascode transistors in series with each differential pair of transistors in accordance with various aspects described herein.

FIG. 9 shows a diagram illustrating example, non-limiting embodiments of a device having differential pairs of transistors and cascode transistors in series with each differential pair of transistors in accordance with various aspects described herein. As shown in FIG. 9, in some embodiments, the first cascode transistors may be distributed at the output of each bit slice. For example, separate cascode transistors 930 are shown, where each of the separate cascode transistors has a source node coupled to the drain node of a corresponding driver transistor in each bit slice. Similar to the device shown in FIG. 8, cascode transistors 930 are biased with a bias network having a bias voltage of BIAS1.

Figure 10:
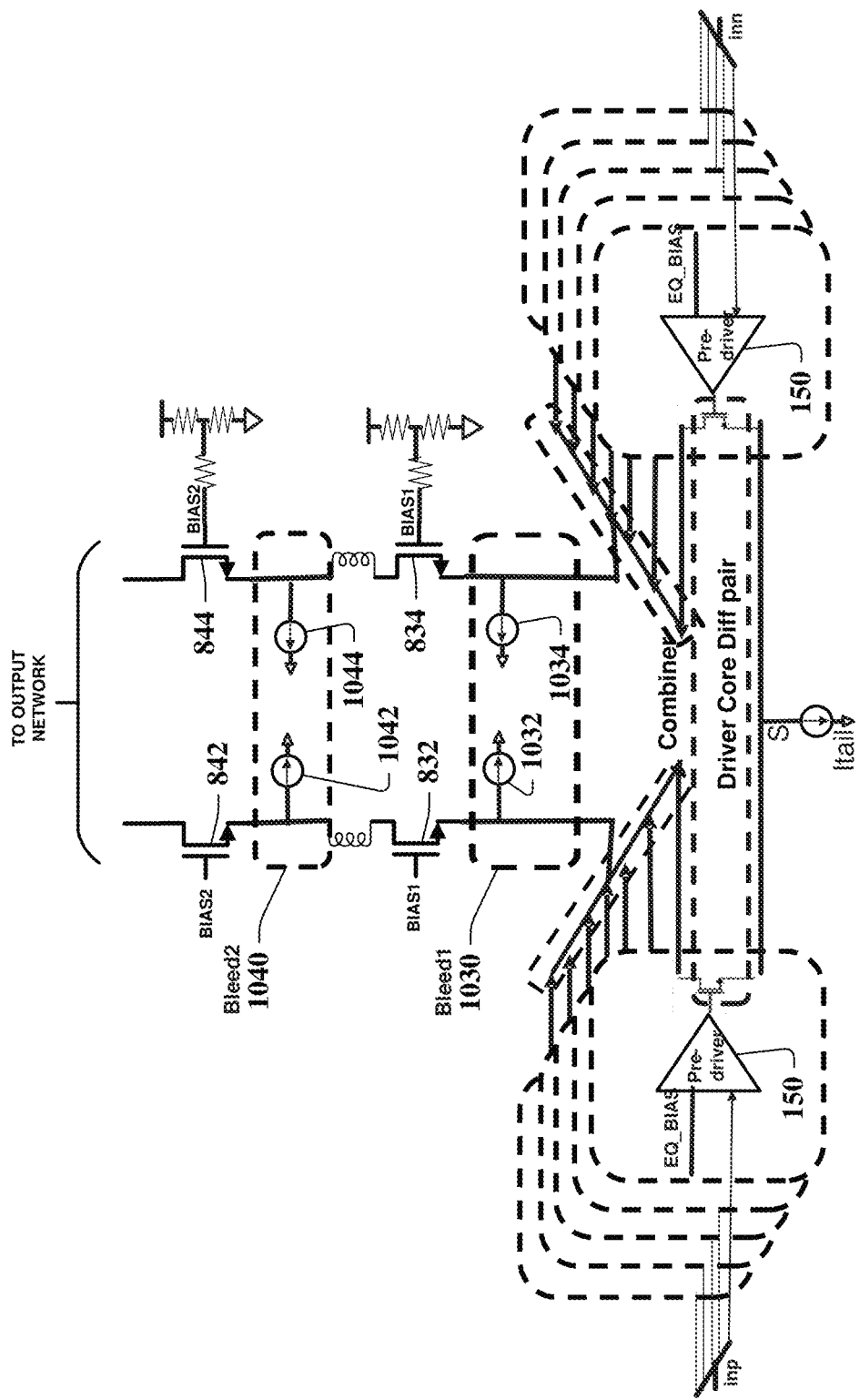
FIG. 10 shows a diagram illustrating example, non-limiting embodiments of a device having current bleed paths to bleed current from sources terminals of the cascode transistors in accordance with various aspects described herein.

FIG. 10 shows a diagram illustrating example, non-limiting embodiments of a device having current bleed paths to bleed current from sources terminals of the cascode transistors in accordance with various aspects described herein. As shown in FIG. 10, bleed paths 1030 are coupled in a manner to bleed current from the source nodes of the first cascode transistors. For example, bleed path 1032 is coupled to the source node of cascode transistor 832, and bleed path 1034 is coupled to the source node of cascode transistor 834. Similarly, bleed paths 1040 are coupled in a manner to bleed current from the source nodes of the second cascode transistors. For example, bleed path 1042 is coupled to the source node of cascode transistor 842, and bleed path 1044 is coupled to the source node of cascode transistor 844.

In some embodiments, the various bleed paths shown in FIG. 10 are configured to conduct a constant current regardless of other operating conditions of the device. For example, in some embodiments, bleed paths 1032 and 1034 include fixed current sources that bleed a fixed amount of current from the source nodes of cascode transistors 832 and 834. The amount of bleed current conducted by bleed paths 1032 and 1034 may be selected based on various factors. For example, the bleed current through bleed paths 1032 and 1034 may be set to a current value such that a drain-to-source current conducted in cascode transistors 832 and 834 never drops below a certain value. Also for example, in some embodiments, bleed paths 1032 and 1034 include circuitry to commence conducting current when a voltage on the source node of the corresponding cascode transistor increases above a threshold.

Similar to bleed paths 1030, bleed paths 1042 and 1044 may include fixed current sources that bleed a fixed amount of current from the source nodes of cascode transistors 842 and 844. The amount of bleed current conducted by bleed paths 1042 and 1044 may be selected based on various factors. For example, the bleed current through bleed paths 1042 and 1044 may be set to a current value such that the drain-to-source current conducted in cascode transistors 842 and 844 never drops below a certain value. Also for example, in some embodiments, bleed paths 1042 and 1044 include circuitry to commence conducting current when a voltage on the source node of the corresponding cascode transistor increases above a threshold.

In some embodiments, the bleed current values of the bleed paths 1030 and 1040 may be set dynamically by controlling a current source within the bleed paths from outside the device. For example, the operation of a bias network or current source may be influenced by an external voltage placed on a bump of the integrated circuit die that is coupled to a bias network or the current source. In some embodiments, the operation of one or both of bleed paths 1030 and 1040 may be modified based on an output peak-to-peak voltage seen at the device. For example, if the output peak-to-peak voltage increases beyond a threshold that represents a maximum allowable voltage value, one or both of the bleed currents through bleed paths 1030 and 1040 may be increased.

In some embodiments, the operation of bleed paths 1030 and 1040 may increase bandwidth by ensuring that a drain-to-source current is always conducted within each of the cascode transistors. Also in some embodiments, the operation of bleed paths 1030 and 1040 may protect various circuit elements from over voltage conditions by reducing the maximum output peak-to-peak voltage on the drain nodes of cascode transistors 842 and 844.

Figure 11:
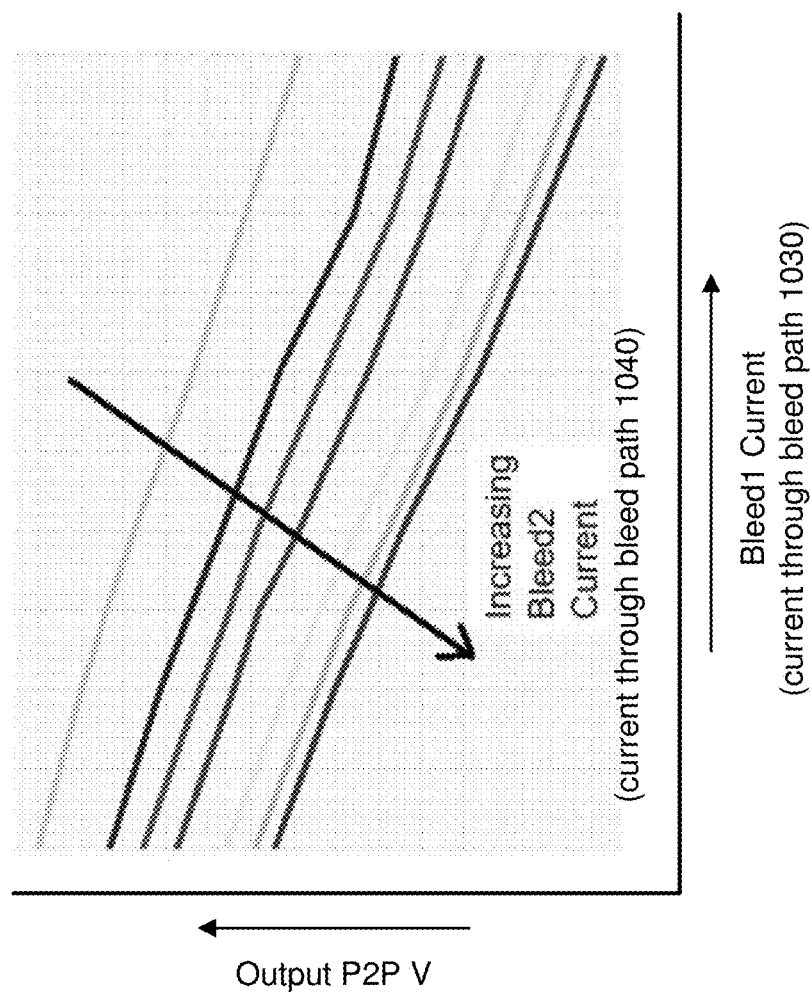
FIG. 11 shows a diagram illustrating example, non-limiting embodiments of a plot showing the effects of various bleed current values on output peak-to-peak voltage in accordance with various aspects described herein.

FIG. 11 shows a diagram illustrating example, non-limiting embodiments of a plot showing the effects of various bleed current values on output peak-to-peak voltage in accordance with various aspects described herein. As shown in FIG. 11, the output peak-to-peak voltage is reduced as the bleed current in either of bleed paths 1030 and 1040 is increased. For example, for a fixed bleed current through bleed paths 1040 (represented by one of the sloped lines) the output peak-to-peak voltage drops as the bleed current through bleed paths 1030 is increased. Also for example, for a fixed bleed current through bleed paths 1030 (represented by a fixed value on the horizontal axis) the output peak-to-peak voltage drops as the bleed current through bleed paths 1040 increased.

Figure 12:
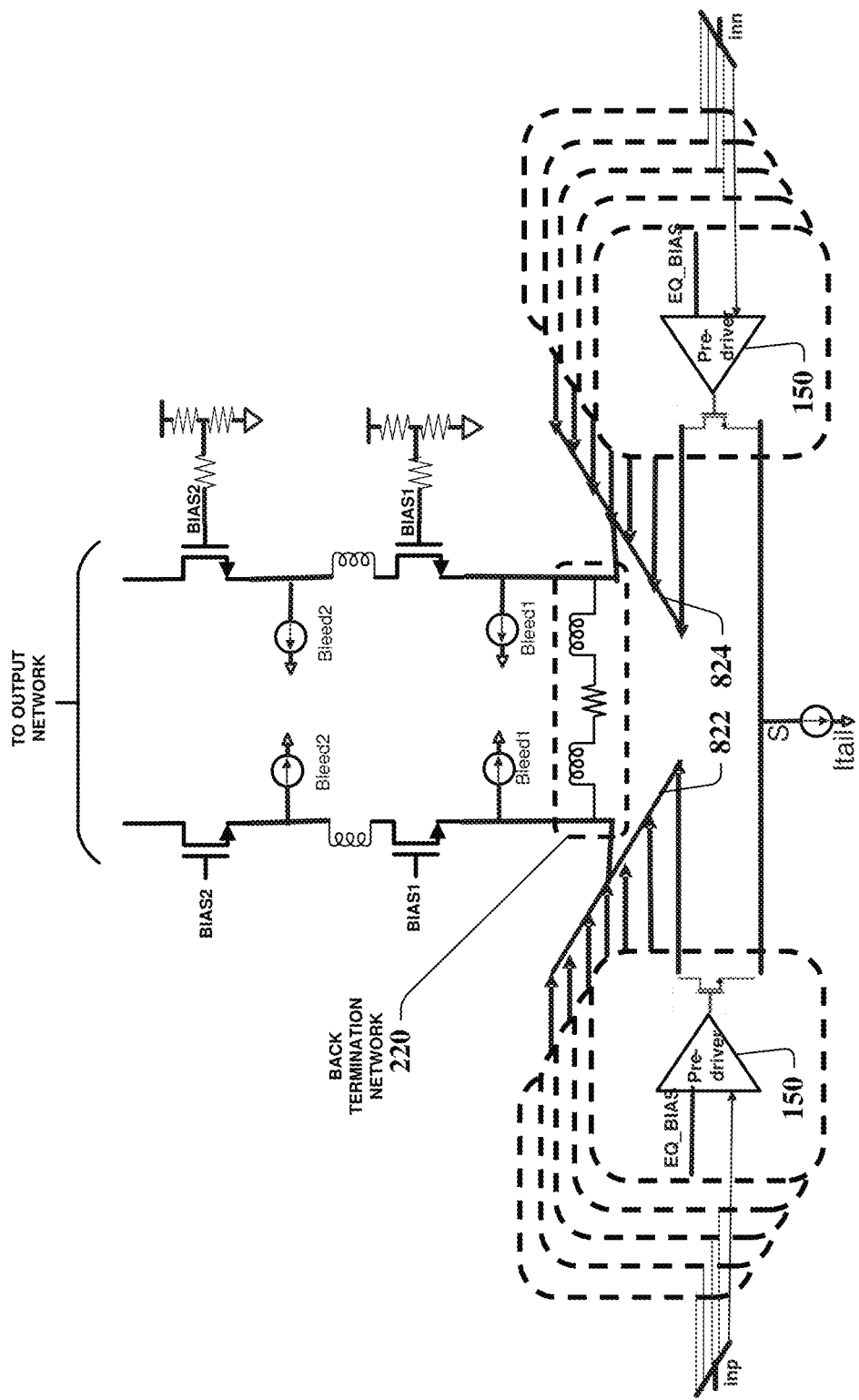
FIG. 12 shows a diagram illustrating example, non-limiting embodiments of a device having a back termination network in accordance with various aspects described herein.

FIG. 12 shows a diagram illustrating example, non-limiting embodiments of a device having a back termination network in accordance with various aspects described herein. Back termination network 220 is coupled between combiner nodes 822 and 824. In various embodiments, back termination network 220 includes a resistor that further boosts the bandwidth of the driver while maintaining uniform group delay over a wide range of frequencies.

Figure 13:
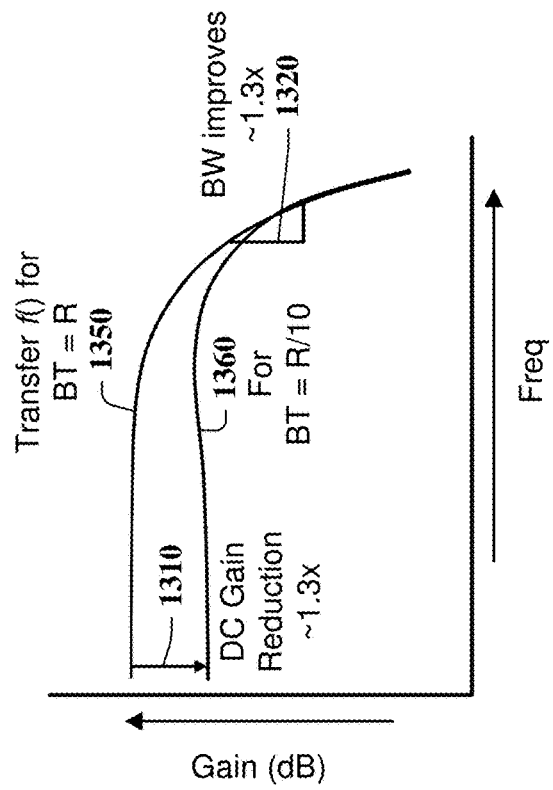
FIG. 13 shows a diagram illustrating example, non-limiting embodiments of a plot showing the effects of various back termination resistor values on gain and bandwidth in accordance with various aspects described herein.

FIG. 13 shows a diagram illustrating example, non-limiting embodiments of a plot showing the effects of various back termination resistor values on gain and bandwidth in accordance with various aspects described herein. As shown in FIG. 13, a properly selected back termination resistor value improves bandwidth with reasonable peaking response. For example, a transfer function for the device with a back termination resistor having a value of R is shown at 1350, and a transfer function for the device with a back termination resistor having a value of R/10 is shown at 1360. By reducing the back termination resistor value by a factor of 10, the DC gain is reduced by approximately 1.3 times as shown at 1310, and the 3 dB bandwidth is also improved by approximately 1.3 times as shown at 1320.

Figure 14:
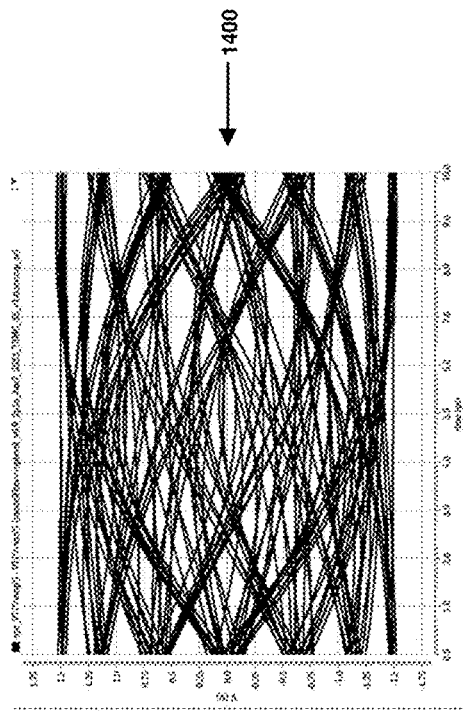
FIGS. 14 and 15 show diagrams illustrating example, non-limiting embodiments of plots showing the effects of various back termination resistor values on PAM4 eye diagrams in accordance with various aspects described herein.
Figure 15:
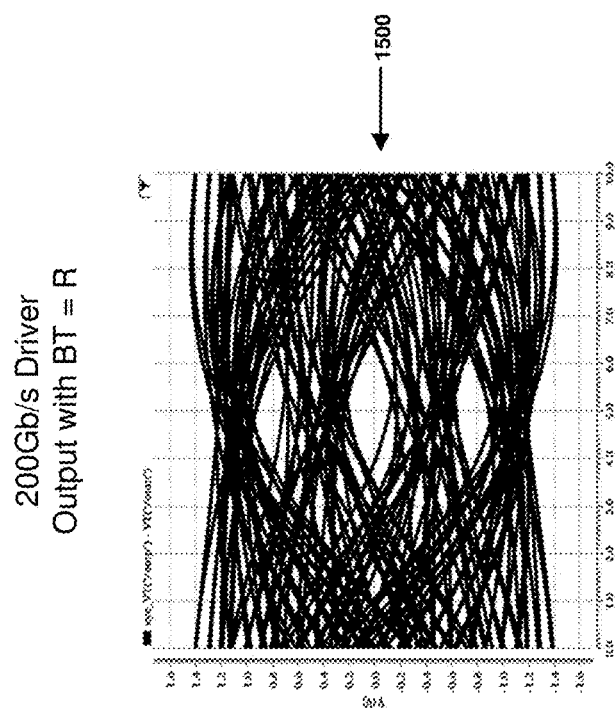

FIGS. 14 and 15 show diagrams illustrating example, non-limiting embodiments of plots showing the effects of various back termination resistor values on PAM4 eye diagrams in accordance with various aspects described herein. FIG. 14 shows a PAM4 eye diagram at 1400 that corresponds to a 200 gigabits per second driver output with a back termination resistor of value of R. FIG. 15 shows a PAM4 eye diagram at 1500 that corresponds to a 200 gigabits per second driver output with a back termination resistor value of R/10. The increased separation and eye openings seen in FIG. 15 correspond to the bandwidth improvement described above with reference to FIG. 13.

Figure 16:
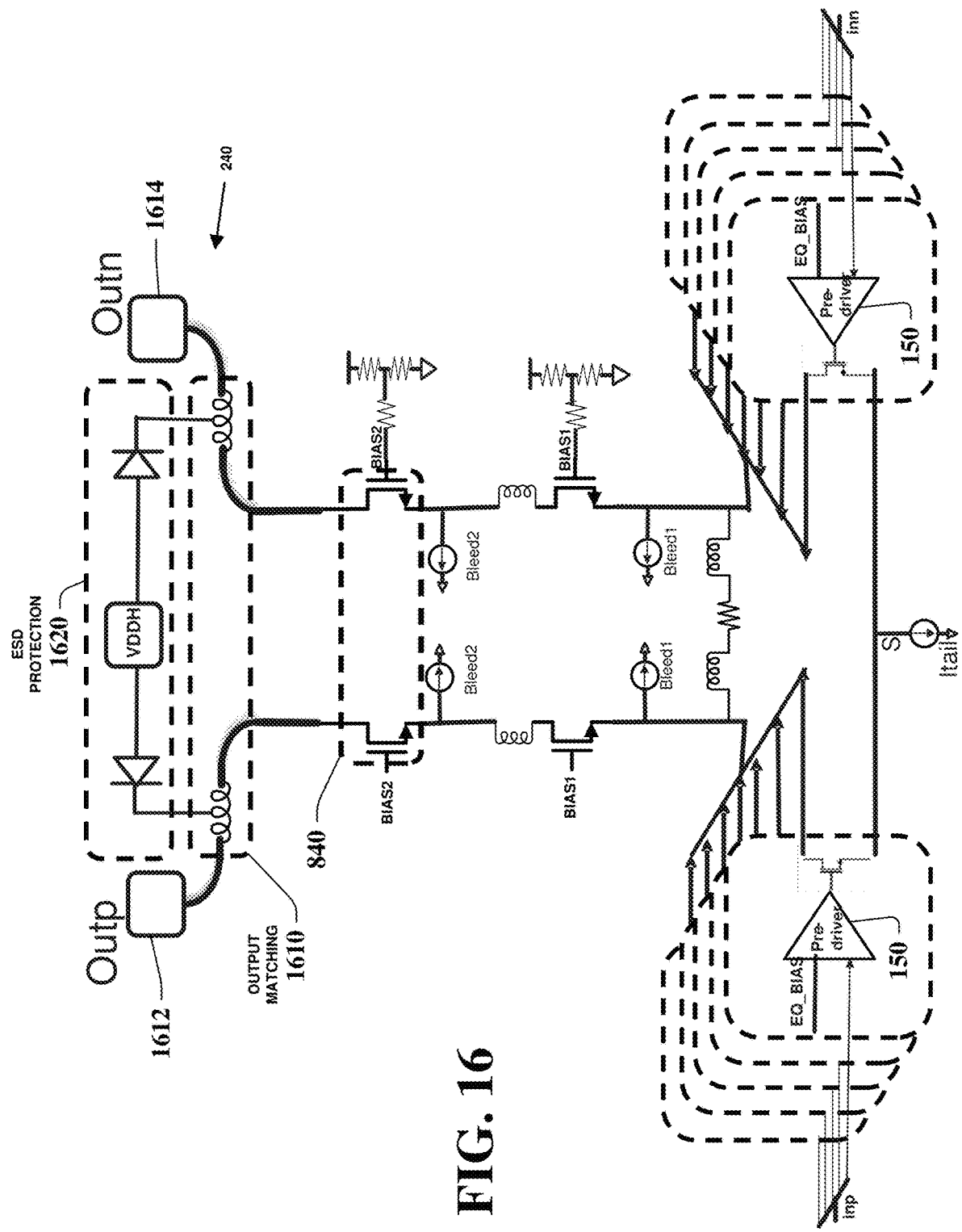
FIG. 16 shows a diagram illustrating example, non-limiting embodiments of a device having an output network in accordance with various aspects described herein.

FIG. 16 shows a diagram illustrating example, non-limiting embodiments of a device having an output network in accordance with various aspects described herein. FIG. 16 shows output network 240 which includes output matching network 1610, ESD protection network 1620, and output bumps 1612 and 1614 coupled to the drain nodes of the cascode transistors 840.

Figure 17:
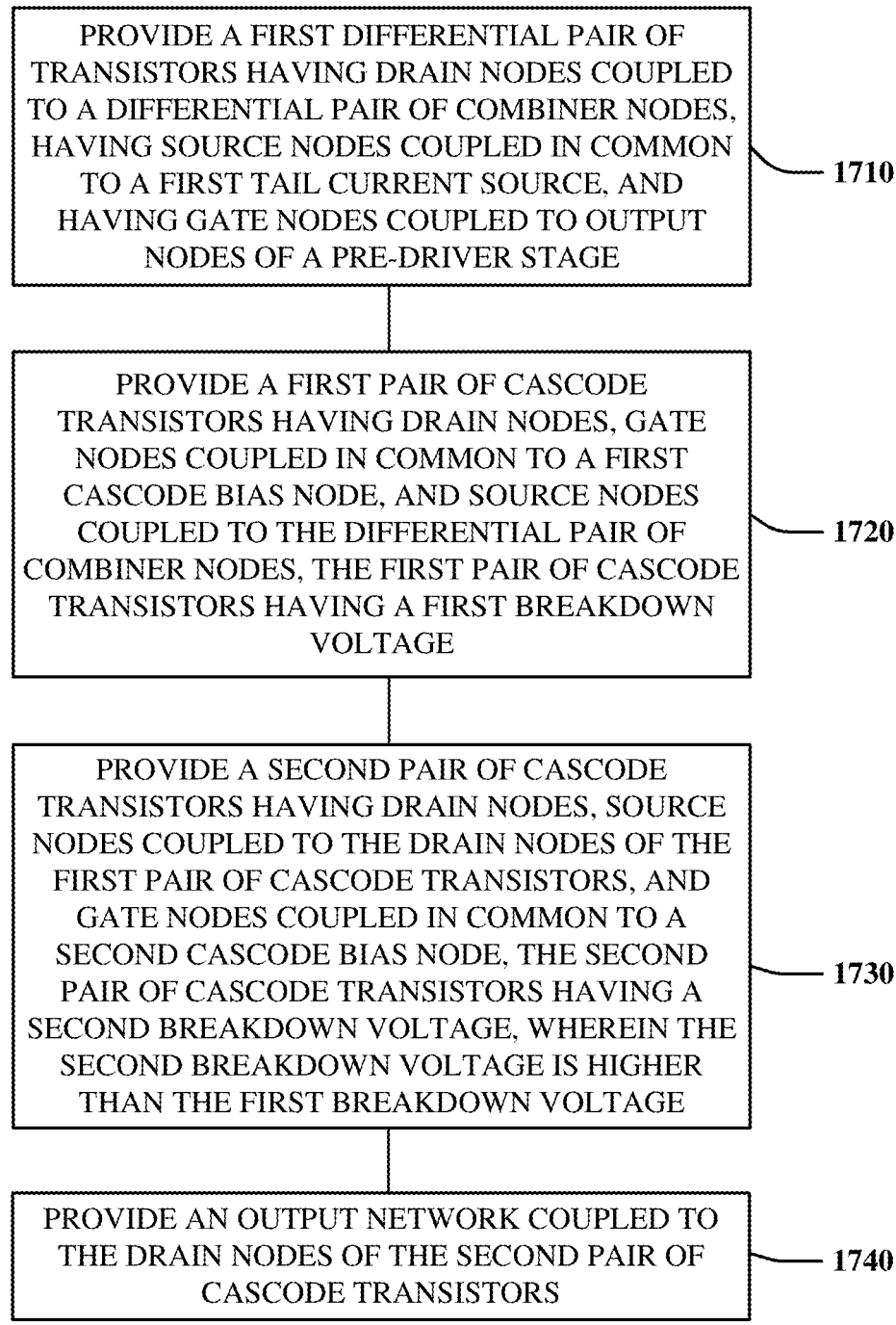
FIG. 17 shows an illustrative embodiment of a method in accordance with various aspects described herein.

FIG. 17 depicts an illustrative embodiment of a method in accordance with various aspects described herein. At 1710 of method 1700, a first differential pair of transistors is provided having drain nodes coupled to a differential pair of combiner nodes, having source nodes coupled in common to a first tail current source, and having gate nodes coupled to output nodes of a pre-driver stage. In some embodiments, the operations of 1710 correspond to providing NMOS transistors 460 and 470 within block 206 (FIG. 4) having gate nodes coupled to the outputs of pre-driver stage 150 (FIG. 4). In various embodiments, the pre-driver stage includes a load configured as an active inductor, and also in some embodiments, neutralization capacitors are included cross-coupled between the gate node of each of the differential pair of transistors and the drain node of the complementary transistor of the differential pair of transistors.

At 1720, a first pair of cascode transistors is provided. The first pair of cascode transistors has drain nodes, gate nodes coupled in common to a first cascode bias node, and source nodes coupled to the differential pair of combiner nodes, the first pair of cascode transistors having a first breakdown voltage. In various embodiments, the actions of 1720 correspond to providing a pair of cascode transistors such as cascode transistors 830 (FIG. 8). In some embodiments, the first pair of cascode transistors have a first breakdown voltage that may or may not be equal to the breakdown voltage of the transistors within the differential pair of transistors. For example, in some embodiments, the differential pair of transistors may be implemented as a first type of transistor (e.g., an extremely low threshold voltage, or "ELVT" transistor), and the first pair of cascode transistor may also be implemented as the first type of transistor. In other embodiments, the differential pair of transistors may be implemented as a first type of transistor, and the first pair of cascode transistors may be implemented as a different type of transistor. As used herein, the term "type of transistor" may refer to a different size of transistor, one or more different dimensions within the transistor, different materials used within the transistor, and the like. Further, an IC vendor may designers with a library of transistors that may be instantiated in a design, and the "type of transistor" may correspond to different transistors in the vendor's library.

At 1730, a second pair of cascode transistors is provided. The second pair of cascode transistors has drain nodes, source nodes coupled to the drain nodes of the first pair of cascode transistors, and gate nodes coupled in common to a second cascode bias node, the second pair of cascode transistors having a second breakdown voltage, wherein the second breakdown voltage is higher than the first breakdown voltage. In various embodiments, the actions of 1730 correspond to providing cascode transistors 840 (FIG. 8) which may be a different type of transistor from the type of transistor used to implement cascode transistors 830. For example, cascode transistors 840 may have different device dimensions, different gate oxide thickness, different channel length or width, or any other difference that may result in a different breakdown voltage.

At 1740, an output network is provided. The output network is coupled to the drain nodes of the second pair of cascode transistors. In various embodiments, the actions of 1740 correspond to providing an output network such as output network 240, which includes output matching network 1610, ESD protection network 1620, and output bumps 1612 and 1614 (FIG. 16).

In some embodiments, a series speaking circuit is provided between the first pair of cascode transistors and the second pair of cascode transistors. Also in some embodiments, a back termination network is included between the two combiner nodes. In further embodiments, multiple bit slices are included, where each bit slice includes a differential pair of transistors having source nodes coupled in common to a different tail current source.

While for purposes of simplicity of explanation, the respective processes are shown and described as a series of blocks in FIG. 17, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Note, one or more blocks can be performed in response to one or more other blocks.

Further, some portions of embodiments can be combined with portions of other embodiments.

The terms "first," "second," "third," and so forth, as used in the claims, unless otherwise clear by context, is for clarity only and does not otherwise indicate or imply any order in time. For instance, "a first determination," "a second determination," and "a third determination," does not indicate or imply that the first determination is to be made before the second determination, or vice versa, etc.

In the subject specification, terms such as "store," "storage," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can comprise both volatile and nonvolatile memory, by way of illustration, and not limitation, volatile memory, non-volatile memory, disk storage, and memory storage. Further, nonvolatile memory can be included in read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Moreover, it will be noted that the disclosed subject matter can be practiced with other computer system configurations, comprising single-processor or multiprocessor computer systems, mini-computing devices, mainframe computers, as well as personal computers, hand-held computing devices (e.g., PDA, phone, smartphone, watch, tablet computers, netbook computers, etc.), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

In one or more embodiments, information regarding use of services can be generated including services being accessed, media consumption history, user preferences, and so forth. This information can be obtained by various methods including user input, detecting types of communications (e.g., video content vs. audio content), analysis of content streams, sampling, and so forth. The generating, obtaining and/or monitoring of this information can be responsive to an authorization provided by the user. In one or more embodiments, an analysis of data can be subject to authorization from user(s) associated with the data, such as an opt-in, an opt-out, acknowledgement requirements, notifications, selective authorization based on types of data, and so forth.

As used in some contexts in this application, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, computer-executable instructions, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable device or computer-readable storage/communications media. For example, computer readable storage media can include, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or". That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, terms such as "user equipment," "mobile station," "mobile," "subscriber station," "access terminal," "terminal," "handset," "mobile device" (and/or terms representing similar terminology) can refer to a wireless device utilized by a subscriber or user of a wireless communication service to receive or convey data, control, voice, video, sound, gaming or substantially any data-stream or signaling-stream. The foregoing terms are utilized interchangeably herein and with reference to the related drawings.

Furthermore, the terms "user," "subscriber," "customer," "consumer" and the like are employed interchangeably throughout, unless context warrants particular distinctions among the terms. It should be appreciated that such terms can refer to human entities or automated components supported through artificial intelligence (e.g., a capacity to make inference based, at least, on complex mathematical formalisms), which can provide simulated vision, sound recognition and so forth.

As employed herein, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components or any combination thereof designed to perform the functions described herein. Processors can exploit nano-scale architectures such as, but not limited to, molecular and quantum-dot based transistors, switches and gates, in order to optimize space usage or enhance performance of user equipment. A processor can also be implemented as a combination of computing processing units.

As used herein, terms such as "data storage," data storage," "database," and substantially any other information storage component relevant to operation and functionality of a component, refer to "memory components," or entities embodied in a "memory" or components comprising the memory. It will be appreciated that the memory components or computer-readable storage media, described herein can be either volatile memory or nonvolatile memory or can include both volatile and nonvolatile memory.

What has been described above includes mere examples of various embodiments. It is, of course, not possible to describe every conceivable combination of components or methodologies for purposes of describing these examples, but one of ordinary skill in the art can recognize that many further combinations and permutations of the present embodiments are possible. Accordingly, the embodiments disclosed and/or claimed herein are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

As may also be used herein, the term(s) "operably coupled to", "coupled to", and/or "coupling" includes direct coupling between items and/or indirect coupling between items via one or more intervening items. Such items and intervening items include, but are not limited to, junctions, communication paths, components, circuit elements, circuits, functional blocks, and/or devices. As an example of indirect coupling, a signal conveyed from a first item to a second item may be modified by one or more intervening items by modifying the form, nature or format of information in a signal, while one or more elements of the information in the signal are nevertheless conveyed in a manner than can be recognized by the second item. In a further example of indirect coupling, an action in a first item can cause a reaction on the second item, as a result of actions and/or reactions in one or more intervening items.

Although specific embodiments have been illustrated and described herein, it should be appreciated that any arrangement which achieves the same or similar purpose may be substituted for the embodiments described or shown by the subject disclosure. The subject disclosure is intended to cover any and all adaptations or variations of various embodiments. Combinations of the above embodiments, and other embodiments not specifically described herein, can be used in the subject disclosure. For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

What is claimed is:

1. A device comprising:
   a first differential pair of transistors having drain nodes coupled to a differential pair of combiner nodes, having source nodes coupled in common to a first tail current source, and having gate nodes coupled to output nodes of a pre-driver stage;
   a first pair of cascode transistors having drain nodes, gate nodes coupled in common to a first cascode bias node, and source nodes coupled to the differential pair of combiner nodes, the first pair of cascode transistors having a first breakdown voltage;
   a second pair of cascode transistors having drain nodes, source nodes coupled to the drain nodes of the first pair of cascode transistors, and gate nodes coupled in common to a second cascode bias node, the second pair of cascode transistors having a second breakdown voltage, wherein the second breakdown voltage is higher than the first breakdown voltage; and
   an output network coupled to the drain nodes of the second pair of cascode transistors.

2. The device of claim 1, further comprising a plurality of differential pairs of transistors having drain nodes coupled to the differential pair of combiner nodes, wherein each differential pair of transistors of the plurality of differential pairs of transistors have source nodes coupled in common to one of a plurality of tail current sources, wherein the first differential pair of transistors is one of the plurality of differential pairs of transistors, and wherein the first tail current source is one of the plurality of tail current sources.

3. The device of claim 1, further comprising:
   a first pair of current bleed paths configured to conduct a first pair of bleed currents from the source nodes of the first pair of cascode transistors; and
   a second pair of current bleed paths configured to conduct a second pair of bleed currents from the source nodes of the second pair of cascode transistors.

4. The device of claim 3, wherein each of the second pair of current bleed paths are configured to turn on when a source voltage on a corresponding one of the second pair of cascode transistors rises above a threshold voltage.

5. The device of claim 3, wherein each of the second pair of current bleed paths are configured to maintain at least a first drain-to-source current through a corresponding one of the second pair of cascode transistors.

6. The device of claim 3, wherein the second pair of current bleed paths are configured to set a maximum voltage on the drain nodes of the second pair of cascode transistors.

7. The device of claim 1, wherein the device is configured to provide control of a first cascode bias voltage on the first cascode bias node from outside the device.

8. The device of claim 1, wherein the device is configured to provide control of a second cascode bias voltage on the second cascode bias node from outside the device.

9. The device of claim 1, further comprising a back termination network coupled between the differential pair of combiner nodes.

10. The device of claim 1, wherein the output nodes of the pre-driver stage include a first output node and a second output node, wherein the first output node is coupled to a gate node of a first transistor of the first differential pair of transistors and the second output node is coupled to a gate node of a second transistor of the first differential pair of transistors, and wherein the pre-driver stage comprises:
- a first pre-driver transistor having a drain node coupled to the first output node of the pre-driver stage;
- a first active inductor device coupled to the first output node of the pre-driver stage;
- a second pre-driver transistor having a drain node coupled to the second output node of the pre-driver stage; and
- a second active inductor device coupled to the second output node of the pre-driver stage.

11. The device of claim 10, wherein the first and second active inductor devices are configured to be responsive to an active inductor bias voltage.

12. The device of claim 11, wherein the device is configured to provide control of the active inductor bias voltage from outside the device.

13. The device of claim 10, further comprising:
- a first neutralization capacitor coupled between the first output node of the pre-driver stage and the drain node of the second transistor of the first differential pair of transistors; and
- a second neutralization capacitor coupled between the second output node of the pre-driver stage and the drain node of the first transistor of the first differential pair of transistors.

14. A device comprising:
- a plurality of pairs of differential transistors having drain nodes coupled to a pair of differential combiner nodes, wherein each pair of differential transistors of the plurality of pairs of differential transistors have source nodes coupled in common to a corresponding one current source of a plurality of current sources;
- a pair of differential output nodes;
- a double cascode network of transistors coupled between the pair of differential combiner nodes and the pair of differential output nodes; and
- at least one current bleed path coupled to the double cascode network of transistors, wherein the at least one current bleed path is configured to provide a drain-to-source current through at least one transistor of the double cascode network of transistors.

15. The device of claim 14, further comprising a back termination network coupled between the pair of differential combiner nodes, wherein the back termination network includes at least one resistor.

16. The device of claim 14, wherein the double cascode network of transistors is configured to be responsive to a bias voltage that can be varied from outside the device.

17. The device of claim 14, wherein the double cascode network of transistors includes a first pair of cascode transistors having a first breakdown voltage, and a second pair of cascode transistors having a second breakdown voltage, and wherein the first and second breakdown voltages are different.

18. A method, comprising:
- providing a first pair of cascode transistors having a first breakdown voltage, wherein the first pair of cascode transistors are coupled to an output of a differential amplifier;
- providing differential output nodes;
- providing a second pair of cascode transistors having a second breakdown voltage, wherein the second pair of cascode transistors are coupled between the first pair of cascode transistors and the differential output nodes, and wherein the second breakdown voltage is greater than the first breakdown voltage.

19. The method of claim 18, further comprising:
- providing at least one first current bleed path coupled to at least one transistor of the first pair of cascode transistors, wherein the at least one first current bleed path is configured to maintain at least a first drain-to-source current through the at least one transistor of the first pair of cascode transistors.

20. The method of claim 19, further comprising:
- providing at least one second current bleed path coupled to at least one transistor of the second pair of cascode transistors, wherein the at least one second current bleed path is configured to maintain at least a second drain-to-source current through the at least one transistor of the second pair of cascode transistors.

* * * * *